United States Patent [19]
Wilson

[11] Patent Number: 4,751,406
[45] Date of Patent: Jun. 14, 1988

[54] ECL CIRCUIT WITH OUTPUT TRANSISTOR AUXILIARY BIASING CIRCUIT

[75] Inventor: Stanley Wilson, Sunnyvale, Calif.

[73] Assignee: Advanced Micro Devices, Inc., Sunnyvale, Calif.

[21] Appl. No.: 730,706

[22] Filed: May 3, 1985

[51] Int. Cl.⁴ .................... H03K 19/086; H03K 3/01
[52] U.S. Cl. .................................. 307/455; 307/467; 307/296 R
[58] Field of Search ............... 307/455, 467, 254, 296, 307/296.1

[56] References Cited
U.S. PATENT DOCUMENTS

| | | | |
|---|---|---|---|
| 3,612,911 | 8/1978 | Kroos | 307/455 |
| 4,195,358 | 3/1980 | Yuen | 307/467 |
| 4,408,134 | 10/1983 | Allen | 307/467 |

Primary Examiner—Stanley D. Miller
Assistant Examiner—B. P. Davis
Attorney, Agent, or Firm—Patrick T. King; Warren M. Becker; J. Vincent Tortolano

[57] ABSTRACT

An ECL circuit comprising an output transistor having a base, a resistor coupled to the base, a first circuit responsive to a deselect signal $\overline{OE}$ for drawing a first current through the resistor and a second circuit responsive to the deselect signal $\overline{OE}$ for drawing a second current through the resistor, said first and said second currents combining in said resistor for providing a predetermined turn-off bias potential on said base of said output transistor. The predetermined turn-off bias potential reduces the emitter current of the output transistor such that the noise immunity of a data bus is preserved when a plurality of output transistors are coupled in parallel to the data bus.

7 Claims, 1 Drawing Sheet

ECL CIRCUIT WITH OUTPUT TRANSISTOR AUXILIARY BIASING CIRCUIT

BACKGROUND OF THE INVENTION

1. Field of the Invention

The present invention relates to ECL circuits in general and to an ECL circuit comprising an auxiliary biasing circuit for emphasizing the "turn-off" bias of a deselected ECL output transistor coupled to a data bus in parallel with other deselected ECL output transistors in other ECL circuits in particular.

2. Description of Prior Art

In conventional ECL circuits comprising a plurality of N output transistors coupled in parallel to a data bus terminated by a load corresponding to the characteristic impedance of the bus, it has been the practice to selectively deselect or "turn-off" N−1 of the output transistors when writing data to the bus using the remaining or selected output transistor. The remaining, or selected, output transistor is, of course, turned on and off as a function of the data being written to the bus.

In a typical ECL circuit, as described above, comprising an NPN output transistor, turning off the output transistor involves driving the base of the transistor from 0 volts to −0.8 volts. With −0.8 volts on the base and a −0.8 volt $V_{be}$ drop across the transistor, the emitter potential, i.e. the potential applied to the load, is switched from −0.8 volts to −1.6 volts. The other end of the load is usually at a fixed D.C. voltage, e.g. −2.0 volts.

Ordinarily, a −1.6 volt potential on the emitter of an ECL output transistor and consequently a +0.4 volt drop, i.e. [−1.6−(−2)], across the load is sufficient to turn off a following ECL transistor being driven thereby as well as provide an adequate level of immunity to noise on the bus. However, when a plurality of ECL output transistors are coupled in parallel to the same bus, it has been found that when all of them are "turned off", each of them still conducts enough current to significantly raise the potential drop across the load and thereby reduce the immunity to noise of the bus to inadequate levels. For example, with four ECL output transistors coupled in parallel to a data bus, the potential drop on the bus at a high temperature, e.g. 150° C., may be raised by as much as 50 millivolts from −1.6 volts to −1.55 volts thus reducing the noise immunity of the bus by as much as 50 millivolts.

SUMMARY OF THE INVENTION

In view of the foregoing, a principal object of the present invention is a novel ECL circuit which is responsive to a deselect signal for emphasizing a turn-off bias applied to the base of an output transistor coupled to a data bus in parallel with other ECL output transistors.

In accordance with the above object, the ECL circuit of the present invention takes advantage of the fact that at 150° C. for every 25 millivolt increase in turn-off bias applied to the base of an ECL output transistor as described above, there is a corresponding 50% reduction in its emitter current. By substantially reducing the emitter current of the output transistor in a plurality of ECL circuits coupled in parallel to a data bus, the noise immunity of the data bus is preserved.

In an embodiment of the present invention, the turn-off bias of the ECL output transistor in a deselected ECL circuit relative to the turn-off bias of the output transistor in a selected ECL circuit is increased by 80 millivolts from −0.8 volts to −0.88 volts.

By increasing the turn-off bias of the output transistor in each of the deselected ECL circuits coupled in parallel to the data bus, the potential on the data bus when all of the output transistors are turned off, as occurs when the data input to the selected ECL circuit is at a logical low, is maintained at about −1.6 volts. A low potential of −1.6 volts is considered sufficient for providing adequate noise immunity on the data bus in most applications.

BRIEF DESCRIPTION OF THE DRAWING

The above and other objects, features and advantages of the present invention will become apparent from the following detailed description of the accompanying drawing, in which.

DETAILED DESCRIPTION OF THE DRAWING

Figure 1:
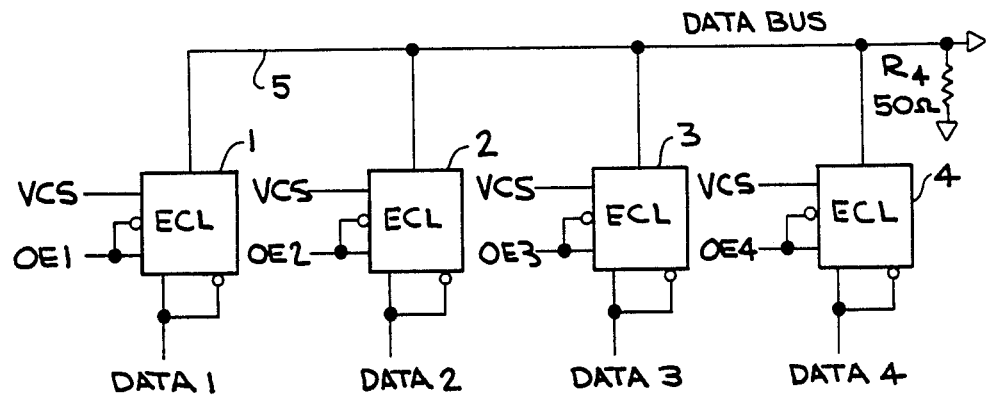
FIG. 1 is a block diagram of a plurality of ECL circuits coupled in parallel to a data bus according to the present invention.

Referring to FIG. 1, there is provided in accordance with the present invention a plurality of ECL circuits 1, 2, 3, and 4 comprising output transistors coupled in parallel to a data bus 5. In a typical embodiment, the data bus 5 is terminated by its characteristic impedance $R_L$, e.g. 50 or 100 ohms.

Each of the ECL circuits 1–4 is provided with a plurality of inputs comprising an input for receiving a first bias potential VCS, an input for receiving an output enable control signal OE and an input for receiving data. Two inputs are provided for receiving the complementary forms of the output enable control signal and data inputs.

Since each of the ECL circuits 1–4 is individually selected, the output enable control signal input OE to each of them is separately identified as OE1, OE2, OE3 and OE4, respectively. For convenience, the data inputs are also separately identified as DATA 1, DATA 2, DATA 3 and DATA 4.

While the invention is described above with respect to an embodiment using complementary data and OE inputs, it should be noted that the apparatus of the present invention will work also in a single-ended mode for both DATA and OE inputs. This means that the DATA input could be replaced by a VBB1 reference D.C. voltage and that the OE input could be replaced by a VBB2 D.C. reference voltage, in which case VBB1 and VBB2 (or either one) would need to be provided as inputs.

Figure 2:
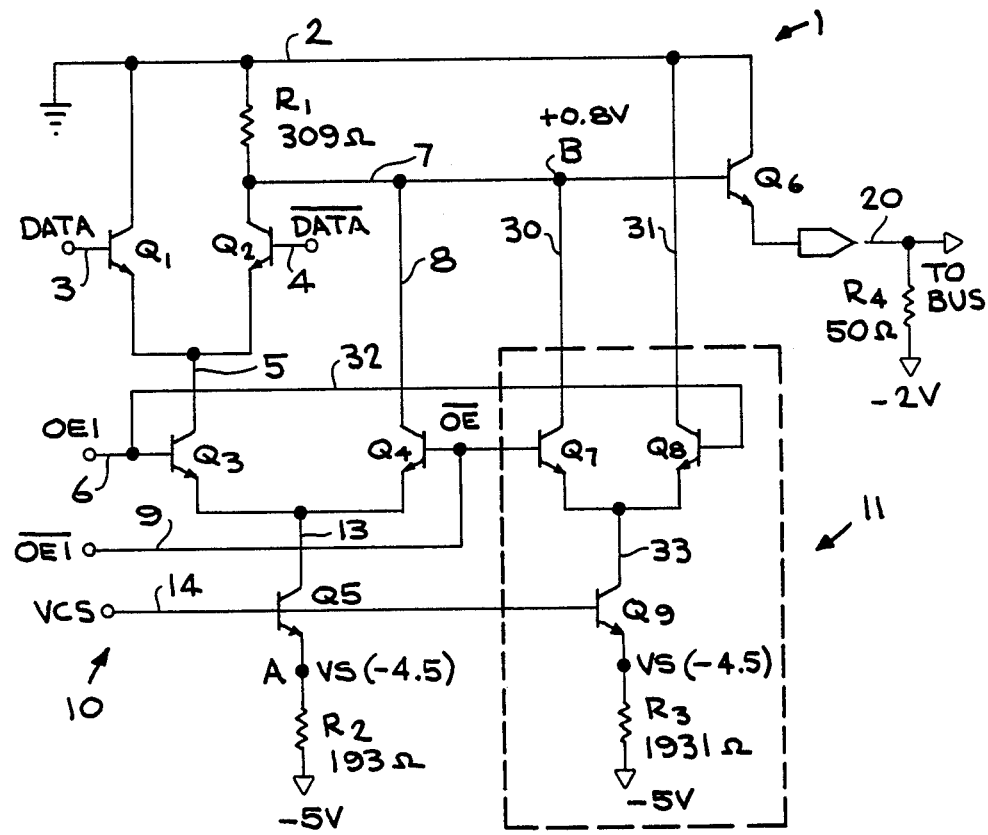
FIG. 2 is a schematic diagram of one of the ECL circuits of FIG. 1.

Referring to FIG. 2, ECL circuit 1 will now be described in detail, it being understood that all of the ECL circuits 1–4 are identical.

In circuit 1 there is provided conventional ECL data processing circuitry 10 and ECL output transistor auxiliary biasing circuitry 11 comprising a plurality of NPN transistors Q1–Q9 and a plurality of resistors R1–R3. The collector of transistor Q1 is coupled to a reference pontential, e.g. ground, by means of a line 2. The collector of transistor Q2 is coupled to line 2 by means of a 309 ohm resistor R1. The bases of transistors Q1 and Q2 are provided for receiving data and complementary data signals, DATA and $\overline{\text{DATA}}$, or DATA and D.C. reference VBB1, on a pair of lines 3 and 4, respectively.

The emitters of transistors Q1 and Q2 are coupled in parallel to the collector of the transistor Q3 by means of a line 5. The base of transistor Q3 is provided for receiving an output enable signal OE on a line 6. The collector of transistor Q4 is coupled to the collector of transistor Q2 by means of a pair of lines 7 and 8. The base of transistor Q4 is provided for receiving a complementary output enable signal $\overline{OE}$, or D.C. reference voltage VBB2, on a line 9. The emitters of transistors Q3 and Q4 are coupled in parallel to the collector of the transistor Q5 by means of a line 13. The base of transistor Q5 is provided for receiving a bias signal VCS on a line 14. The emitter of transistor Q5 is coupled to a $-5$ volt power supply by means of a 193 ohm resistor R2.

The transistor Q6 is called an ECL output transistor and is provided with a collector coupled to the reference potential, ground, by means of the line 2 and a base coupled to the collector of transistor Q2 by means of the line 7. The emitter of transistor Q6 is coupled to a data bus 20. The data bus 20 is coupled to a $-2$ volt power supply through a load resistor $R_L$, defined by the characteristic impedance of the bus, normally 50 or 100 ohms.

As thus far described, the ECL circuit 1 is a conventional ECL circuit.

Referring to the output transistor auxiliary biasing circuitry 11, the collector of transistor Q7 is coupled to the base of the transistor Q6 by means of a line 30 and the resistor R1 by means of the line 7. The base of transistor Q7 is provided for receiving the complementary output enable signal $\overline{OE}$, or a D.C. reference voltage VBB2, by means of the line 9. The collector of the transistor Q8 is coupled to the reference potential, ground, by means of a line 31. The base of transistor Q8 is provided for receiving the output enable signal OE by means of a line 32 coupled to the line 6. The emitters of transistors Q7 and Q8 are coupled in common to the collector of transistor Q9 by means of a line 33. The base of transistor Q9 is coupled to the bias potential VCS by means of the line 14. The emitter of transistor Q9 is coupled to the $-5$ volt supply by means of a 1931 ohm resistor R3.

In operation, to enable the ECL circuit 1 to read data to the bus 20, a high level output enable signal OE1 is applied to the base of transistor Q3 and a low level complementary output enable signal $\overline{OE1}$, or a D.C. reference voltage VBB2, is applied to the base of transistor Q4 sending transistor Q3 into conduction. With transistor Q3 conducting, current flows through transistors either Q1 or Q2 and resistor R1, transistor Q3, transistor Q5 and the resistor R2.

With a high level on the data input line 3, current flows through transistor Q1. With current flowing through transistor Q1, the potential at a node B on the base of transistor Q6 is at ground or zero potential.

When complementary data is applied to transistors Q1 and Q2, the base of transistor Q1 goes low and the base of transistor Q2 goes high, or the base of Q1 goes lower than the base of Q2 if the base of Q2 is connected to the D.C. reference voltage VBB1. With the base of transistor Q2 high, current flows through resistor R1, transistor Q2, transistor Q3, transistor Q5 and the resistor R2. The current flowing through the resistor R1 results in a voltage drop across the resistor R1, causing the potential at node B to decrease from 0 volts to $-0.8$ volts reducing the conduction of transistor Q6, causing the potential on line 20 to switch from $-0.8$ to $-1.6$ volts, as Q6 supplies less current into the load resistor $R_L$.

As transistor Q6 is turned on and off in response to the data signals applied to transistors Q1 and Q2, corresponding data signals are generated on the bus 20.

To deselect the ECL circuit 1, the base of transistor Q3 is driven low and the base of transistor Q4 is driven high by a complementary output enable signal $\overline{OE}$, or a D.C. reference voltage VBB2. With transistor Q4 conducting, current is diverted from transistors Q1 and Q2 through the resistor R1, through transistor Q4, transistor Q5 and the resistor R2. The magnitude of the current flow corresponds to the ratio of the resulting voltage VS at the emitter of Q5 and R2. Alternatively, the magnitude of the voltage drop across R1 corresponds to the value of VS times the ratio of the resistors R1 and R2. Once again, the potential at node B at the base of transistor Q6 is driven from 0 volts to a first level of turn-off bias potential $-0.8$ volts, reducing the conduction of transistor Q6. However, with transistor Q4 conducting, ECL circuit 1 is nonresponsive to data inputs on the bases of transistors Q1 and Q2.

The operation of the ECL circuit 1 as thus far described is conventional. It is found, however, that when a plurality of ECL output transistors of ECL circuits, such as the output transistor Q6 of ECL circuit 1, are coupled in parallel to the data bus 20, there is sufficient emitter current in each of the output transistors Q6 and a sufficient resulting voltage drop across the load to cause the low level potential VOL on the data bus 20 to increase significantly from the preferred $-1.6$ volts. For example, it is found that under elevated temperature conditions, e.g. 150° C., the potential VOL on the data bus 20 can rise by as much as 50 millivolts, resulting in an undesirable decrease in the noise immunity of the data bus.

To prevent, or at least minimize, the reduction in noise immunity on the data bus 20, the auxiliary bias circuit 11 emphasizes, i.e. increases, the turn-off bias on the base of the output transistor Q6 when the ECL circuit 1, or any of the ECL circuits 1-4, are deselected by means of the complementary output enable signal $\overline{OE}$, or by lowering OE with respect to the D.C. reference VBB2.

Thus, when the complementary output enable signal $\overline{OE}$ is applied to the base of transistor Q7 of an ECL circuit, such as ECL circuit 1, or OE is lowered with respect to the D.C. reference VBB2, in addition to the current flowing through resistor R1, transistor Q4, transistor Q5 and resistor R2, there is an additional current flow through resistor R1, transistor Q7, transistor Q9 and resistor R3. The magnitude of the additional current flow corresponds to the ratio of the voltage VS at the emitter of Q9 and R3. The increased current flow through resistor R1 results in an additional 80 millivolt drop in potential across the resistor R1. Alternatively, the magnitude of the additional voltage drop across R1 corresponds to the value of VS times the ratio of resistors R1 and R3. Since there is a 50% reduction in emitter current at 150° C. for each 25 millivolt increase in turn-off bias, an 80 millivolt increase in turn-off bias on transistor Q6 will significantly reduce the emitter current in the output transistors Q6 of each of the deselected ECL circuits coupled in parallel to the data bus 20. By reducing the emitter current in each of the output transistors of the deselected ECL circuits by the amount indicated, the low voltage level VOL on the data bus remains close to −1.6 volts, thereby preserving the desired noise immunity of the data bus 20.

While a preferred embodiment of the present invention is described above, it is contemplated that various modifications may be made thereto without departing from the spirit and scope of the present invention. Accordingly, it is intended that the described embodiment be considered only as illustrating the present invention and that the scope of the invention be determined by a reference to the claims hereinafter provided.

What is claimed is:

1. An ECL circuit for providing noise immunity on a data bus when a plurality of such circuits are coupled in parallel to said bus comprising:

an output transistor coupled to said data bus and having a base;

a first pair of transistor means responsive to complementary data signals and coupled to said output transistor for providing corresponding data signals on said bus;

a second pair of transistor means responsive to complementary output enable control signals and coupled to said output transistor for providing a first level of turn-off bias potential on said base of said output transistor;

a first current source coupled to said first and said second pair of transistor means for controlling the magnitude of said first level of turn-off bias potential;

a third pair of transistor means responsive to said complementary output enable control signals and coupled to said output transistor for providing an auxiliary turn-off bias potential on said base of said output transistor; and a second current source coupled to said third pair of transistor means for controlling the magnitude of said auxiliary turn-off bias potential, said magnitude of said auxiliary bias potential being a fraction of said first level of turn-off bias potential.

2. An ECL circuit according to claim 1 wherein said auxiliary turn-off bias potential transistor providing means comprises means for providing a predetermined amount of auxiliary turn-off bias potential to said first level of turn-off bias potential provided by said second pair of transistor circuit means.

3. An ECL circuit according to claim 2 comprising a first, a second and a third resistor and wherein the magnitude of said first level of turn-off bias potential corresponds to the ratio of the magnitudes of said first and said second resistors and the magnitude of said auxiliary turn-off bias potential corresponds to the ratio of the magnitudes of said first and said third resistors.

4. An ECL circuit according to claim 3 wherein said magnitudes of said first, said second and said third resistors comprise approximately 309 ohms, 193 ohms and 1931 ohms, respectively.

5. An ECL circuit according to claim 3 wherein said magnitude of said first level of turn-off potential comprises approximately −0.8 volts and said magnitude of said auxiliary turn-off bias potential comprises approximately −0.08 volts for providing a total turn-off bias potential of approximately −0.88 volts.

6. An ECL circuit for providing noise immunity on a data bus when a plurality of such circuits are coupled in parallel to said bus comprising:

an output transistor coupled to said data bus and having a base;

a first pair of transistor means responsive to complementary data signals and coupled to said output transistor for providing corresponding data signals on said bus;

a second pair of transistor means responsive to complementary output enable control signals and coupled to said output transistor for providing a first level of turn-off bias potential on said base of said output transistor;

a first current source coupled to said first and said second pair of transistor means for controlling the magnitude of said first level of turn-off bias potential;

a third pair of transistor means responsive to said complementary output enable control signals and coupled to said output transistor for providing a predetermined amount of auxiliary turn-off bias potential on said base of said output transistor;

a second current source coupled to said third pair of transistor means for controlling the magnitude of said auxiliary turn-off bias potential, said magnitude of said auxiliary bias potential being a fraction of said first level of turn-off bias potential; and a first, a second and a third resistor comprising 309 ohms, 193 ohms and 1164 ohms, respectively and wherein the magnitude of said first level of turn-off bias potential corresponds to the ratio of the magnitudes of said first and said second resistors and the magnitude of said auxiliary turn-off bias potential corresponds to the ratio of the magnitudes of said first and said third resistors.

7. An ECL circuit for providing noise immunity on a data bus when a plurality of such circuits are coupled in parallel to said bus comprising:

an output transistor coupled to said data bus and having a base;

a first pair of transistor means responsive to complementary data signals and coupled to said output transistor for providing corresponding data signals on said bus;

a second pair of transistor means responsive to complementary output enable control signals and coupled to said output transistor for providing a first level of turn-off bias potential on said base of said output transistor having a magnitude of approximately −0.8 volts;

a first current source coupled to said first and said second pair of transistor means for controlling the magnitude of said first level of turn-off bias potential;

a third pair of transistor means responsive to said complementary output enable control signals and coupled to said output transistor for providing a predetermined amount of auxiliary turn-off bias potential on said base of said output transistor having a magnitude of approximately −0.08 volts;

a second current source coupled to said third pair of transistor means for controlling the magnitude of said auxiliary turn-off bias potential, said magnitude of said auxiliary bias potential being a fraction of said first level of turn-off bias potential; and a first, a second and a third resistor and wherein the magnitude of said first level of turn-off bias potential corresponds to the ratio of the magnitudes of said first and said second resistors and the magnitude of said auxiliary turn-off bias potential corresponds to the ratio of the magnitudes of said first and said third resistors.

* * * * *